(12) United States Patent
Roy

(10) Patent No.: US 6,282,131 B1
(45) Date of Patent: Aug. 28, 2001

(54) SELF-TIMED CLOCK CIRCUITRY IN A MULTI-BANK MEMORY INSTANCE USING A COMMON TIMING SYNCHRONIZATION NODE

(75) Inventor: Richard S. Roy, Danville, CA (US)

(73) Assignee: Virage Logic Corp., Fremont, CA (US)

( * ) Notice: Subject to any disclaimer, the term of this patent is extended or adjusted under 35 U.S.C. 154(b) by 0 days.

(21) Appl. No.: 09/671,456

(22) Filed: Sep. 27, 2000

(51) Int. Cl.$^7$ ....................................................... G11C 7/00
(52) U.S. Cl. ....................... 365/191; 365/233; 365/230.03
(58) Field of Search ..................................... 365/191, 233, 365/194, 210, 230.03

(56) References Cited

U.S. PATENT DOCUMENTS 6,009,501 * 12/1999 Manning ............................... 365/233
6,128,244 * 10/2000 Thompson et al. ............. 365/230.03

* cited by examiner

Primary Examiner—Tan T. Nguyen

(74) Attorney, Agent, or Firm—Smith, Danamraj & Youst, P.C.

(57) ABSTRACT

Self-timed clock circuitry for use in a compilable memory instance using a common timing synchronization node. A plurality of memory banks are provided in the memory instance wherein each memory bank is independently selectable by a bank select (BS) signal generated by a global control circuit. A global timing circuit is provided to drive a common node signal on the common timing synchronization node to a high value upon application of an external master clock and a memory enable signal to the memory instance. The global timing circuit is operable to drive the common node signal high for a predetermined time period. A local driver circuit associated with a particular memory bank selected by a specific BS signal takes over control of driving the common node signal thereafter so as to maintain its high state. Upon completing the memory access operation, a reference signal within the particular memory bank is driven low. Thereafter, the falling edge in the reference signal drives the local driver circuit to drive the common node signal low. The global timing circuit then continues to drive the common node signal low, until a rising edge of the external clock (indicating the beginning of a new access cycle) has been encountered.

19 Claims, 8 Drawing Sheets

SELF-TIMED CLOCK CIRCUITRY IN A MULTI-BANK MEMORY INSTANCE USING A COMMON TIMING SYNCHRONIZATION NODE

BACKGROUND OF THE INVENTION

1. Technical Field of the Invention

The present invention relates generally to high-speed semiconductor memories. More particularly, and not by way of any limitation, the present invention is directed to compilable memory instances having self-timed clock circuitry for synchronizing a falling edge of a signal immediately derived from an external master clock to a falling edge of a common node signal driven by a selected bank in a multi-bank memory architecture.

2. Description of Related Art

Design re-use has emerged as a key solution for successfully addressing the time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system (system-on-chip or SOC). Such re-usable IP components are typically provided as megacells, cores, macros, embedded memories through generators or memory compilers, et cetera.

It is well known that memory is a key technology driver for SOC design. It is also well known that robust performance of memory is pivotal, whether provided in an embedded SOC application or as a stand-alone device. For high speed and high density memories, accordingly, it is desirable that memory access operations are performed without any glitches on the selected wordlines, because such glitches on the wordlines could corrupt data. Further, it is highly desirable for a compiled memory instance to operate with very relaxed requirements on the input clock duty cycle.

One scenario where a wordline (WL) glitch may be encountered is when the falling edge of an external input clock is used to enable the inputting of address information in a multi-bank memory instance, wherein the external clock has a short duty cycle (i.e., short high time). Thus, it is possible that a new address (or an intermediate address if not all predecoders have the same delay) can arrive before the access in a selected memory bank is completed. Consequently, such "early" address signals can glitch the wordline to the new address near the end of the access cycle (which can be a significant problem particularly during a write cycle, where data stored could be corrupted by a false glitch on an unselected WL).

It is therefore highly desirable to have a more or less self-contained timing chain in each bank in a multi-bank memory architecture. Accordingly, a feedback must come from the bank timing chain to a master clock buffer to delay the inputting of the new address and control information into the memory instance until the present memory operation is complete.

SUMMARY OF THE INVENTION

The present invention addresses the requirements with respect to an input clock's short high time (duty cycle) by advantageously providing a self-timed clock circuitry for use in a compilable memory instance using a common timing synchronization node, wherein address input operations of the memory instance for the subsequent cycle are synchronized to arrive after completion of memory access operations. A plurality of memory banks are provided in the memory instance wherein each memory bank is independently selectable by a bank select (BS) signal generated by a global control circuit. A global timing circuit is provided to drive the common timing synchronization node, hereinafter referred to as DBITFB, to a high value upon application of the rising edge of an external master clock and a memory enable signal to the memory instance. The global timing circuit is operable to drive the common node DBITFB signal high for a predetermined time period using a one-shot circuit with programmable delay. A local driver circuit associated with a particular memory bank selected by a specific BS signal takes control of driving the common node DBITFB signal thereafter so as to maintain its high state. It is highly desirable for such a common feedback node to be controllable by both the selected bank as well as the global input clock circuitry, without contention between the two controlling units, and also without the common line floating for any period of time, where it may become susceptible to coupling from a long parallel line which could cause a failing glitch in the common line.

Based upon the specific BS signal (which acts as the "master" clock for the local memory bank), a local clock generator circuit associated with the selected memory bank generates a local wordline clock (LWC) by further decoding a plurality of global wordline clock (GWC) signals to synchronize a memory access operation with respect to a memory location of the selected bank. The LWC signal is also used for synchronizing a dummy access operation involving a dummy memory cell (by way of activating a particular dummy wordline (DWL)), wherein the dummy access operation has substantially the same timing delay as the actual memory access operation. A dummy bitline (DBL) signal is generated upon completing the access operation's timing path and is driven low for firing sense amp circuitry and to enable the shut down of the DWL through LWC signal. A reference signal (SD_CLK) derived from the activation in the negative direction of the DBL signal is subsequently driven low. Thereafter, the falling edge in the reference signal SD_CLK drives the local driver circuit to drive the common node DBITFB signal low. The global timing circuit then continues to drive the common node signal low, until a rising edge of the external clock signal (indicating the beginning of a new memory cycle) has been encountered. The low state of the common node signal opens the input latches for incoming address information for the next memory access operation.

In an exemplary embodiment, the one-shot circuit in the one-time global clock circuitry comprises a plurality of inverters coupled in series wherein the programmable delay portion is operable to provide variable time periods for which the common node DBITFB signal is driven high by the global timing circuit, based on the number of banks in the memory instance. Such variable time periods advantageously accommodate multi-bank memory instances of different heights in a compilable architecture.

In another aspect, the present invention is directed to a timing synchronization method with respect to a memory access operation for synchronizing a falling edge of a signal (referred to as the primary internal clock) derived from an external master clock signal to a falling edge of a common node signal internal to a memory instance having a plurality of banks, in order to guarantee that the internal access has been completed prior to the introduction of new address information into the memory instance. Upon application of the external master clock and memory enable signals to the memory instance, the common node DBITFB signal is driven high for a predetermined time period by a global clock circuit disposed in the memory instance. A particular bank of the memory instance is selected for the memory access operation by asserting a BS signal associated therewith. The common node DBITFB signal is held high by a local driver circuit associated with the local clock generator circuit that is provided for the selected bank. By further decoding a plurality of GWC signals using the BS signal, the local clock generator circuit generates an LWC signal for synchronizing the memory and dummy access operations. Upon completing the access timing path, a DBL signal is driven low which, in turn, drives a reference signal SD_CLK low. The local driver circuit then drives the common node DBITFB signal low. If the falling edge of the external master clock occurs prior to the local driver circuit driving the common node DBITFB signal low, it will be ignored until completion of the operation within the local bank, whereupon SD_CLK will drive the common node low. The primary idea is that in the presently preferred exemplary embodiment of the present invention, the global clock generator circuit always controls the rising edge of the DBITFB common node, and the local bank circuitry always controls the falling edge of DBITFB. Further enhancements are provided to avoid a floating state on DBITFB, which is undesirable due to the possibility of capacitive coupling causing a corruption of the state of the DBITFB node.

BRIEF DESCRIPTION OF THE DRAWINGS

A more complete understanding of the present invention may be had by reference to the following Detailed Description when taken in conjunction with the accompanying drawings wherein.

DETAILED DESCRIPTION OF THE DRAWINGS

Figure 1:
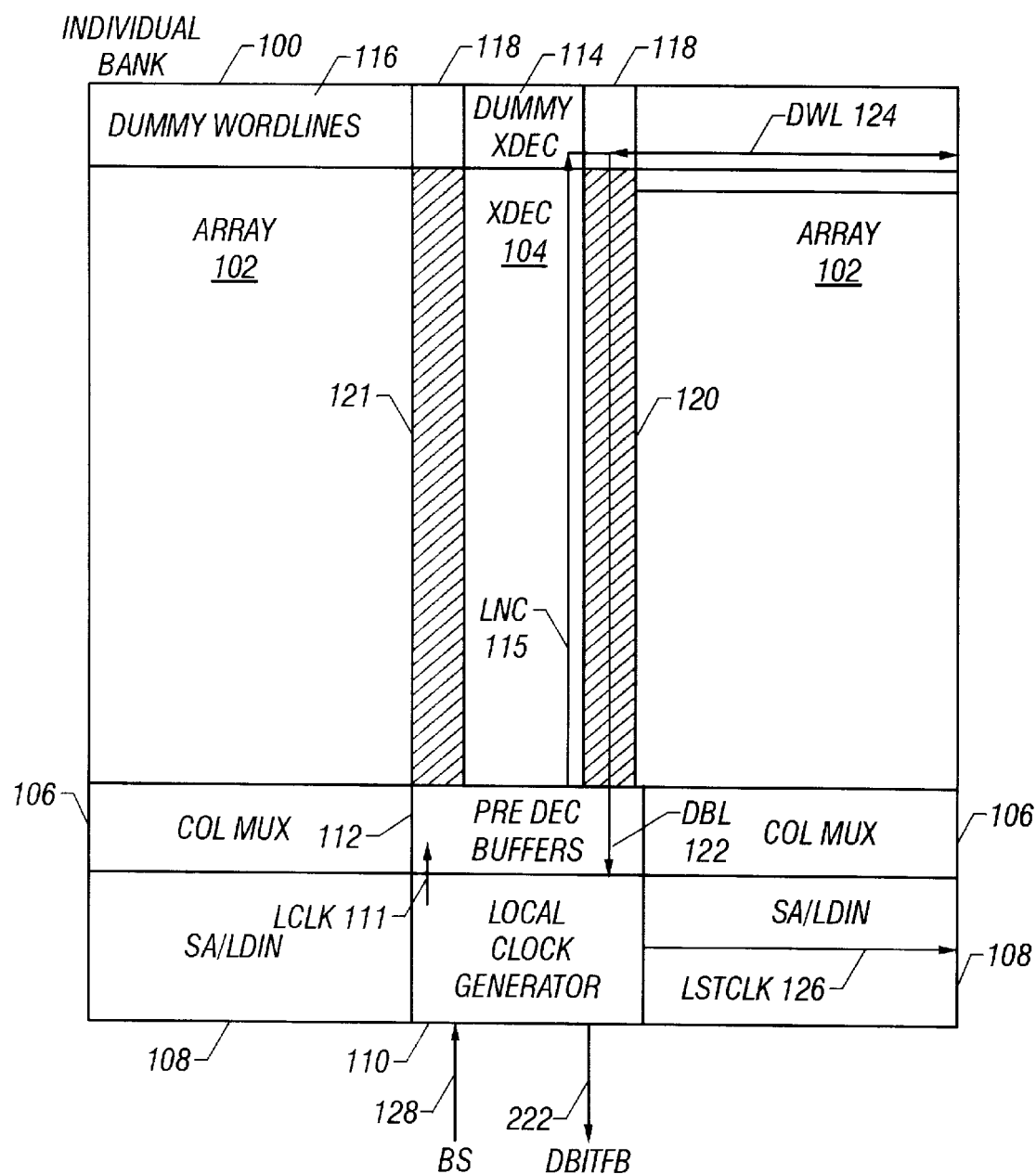
FIG. 1 depicts an exemplary embodiment of an individual memory bank provided in accordance with the teachings of the present invention.

In the drawings, like or similar elements are designated with identical reference numerals throughout the several views thereof, and the various elements depicted are not necessarily drawn to scale. Referring now to FIG. 1, depicted therein is a presently preferred exemplary embodiment of an individual memory bank 100 provided in accordance with the teachings of the present invention. The memory bank 100 comprises an array of memory locations (reference numeral 102) which may be of any known type, e.g., static or dynamic random access memory (SRAM or DRAM), erasable programmable read-only memory (EPROM), etc. A row decoder (XDEC) 104 is disposed in conventional manner for decoding a particular wordline in the array pursuant to a memory access operation. A column mux block 106 and sense amp (SA)/local data-in (LDIN) block 108 are also conventionally provided in the memory bank 100.

To effectuate a dummy access operation, which has a timing path delay that is substantially the same as a primary cell access operation, a dummy memory cell block or blocks (reference numeral 118) is/are provided in the memory bank 100. A dummy wordline (DWL) block 1 16 and a dummy bitline (DBL) block (reference numerals 120, 121) are included for emulating the timing path involved in the memory access operation with respect to a primary cell location disposed in the array 102. A dummy XDEC circuit 114 is utilized for selecting a particular DWL, e.g., DWL 124, in order to effectuate the dummy access operation in the exemplary embodiment shown.

A local clock generator block 110 receives a bank select (BS) signal 128 from a global control circuit (not shown), which is operable to select a particular memory bank, e.g., memory bank 100, disposed in a multi-bank memory instance. BS 128 operates as a "master" clock that is used for decoding a select set of global wordline clock (GWC) signals associated with the selected memory bank in order to generate a local clock (LCLK) signal 111. LCLK signal 111 is provided to a row predecoder block 112 which generates a local wordline clock (LWC) signal 115 that is used for selecting a particular DWL by means of the dummy XDEC circuit 114. In addition, primary XDEC circuit 104 is operable to decode the LWC signal along with other pre-decoded address signals (not shown) to select a particular WL in the array 102 of the memory bank 100.

In general operation, upon accessing a dummy memory cell by activating DWL 124, a DBL signal is 122 is generated on a particular DBL 120 associated with the dummy memory cell. To indicate the completion or substantial completion of the memory access operation, the DBL signal 122 is driven low, which is used by the local clock generator block 110 to fire the Sense Amp (SA) circuitry 108 for sensing data on the selected bitline. To effectuate the SA operation, accordingly, the local clock generator block generates a signal (LSTCLK 126) which is propagated to the SA circuitry 108 for generating an active low Sense Amp Enable (SAEB) signal that is well known in the memory design art. Furthermore, in accordance with the teachings of the present invention, a local driver circuit (not explicitly shown) associated with the local clock generator block 110 drives a common global synchronization node (referred to as DBITFB) signal 222 low for synchronizing the falling edge of an internally derived clock, as will be described in greater detail hereinbelow.

Figure 2:
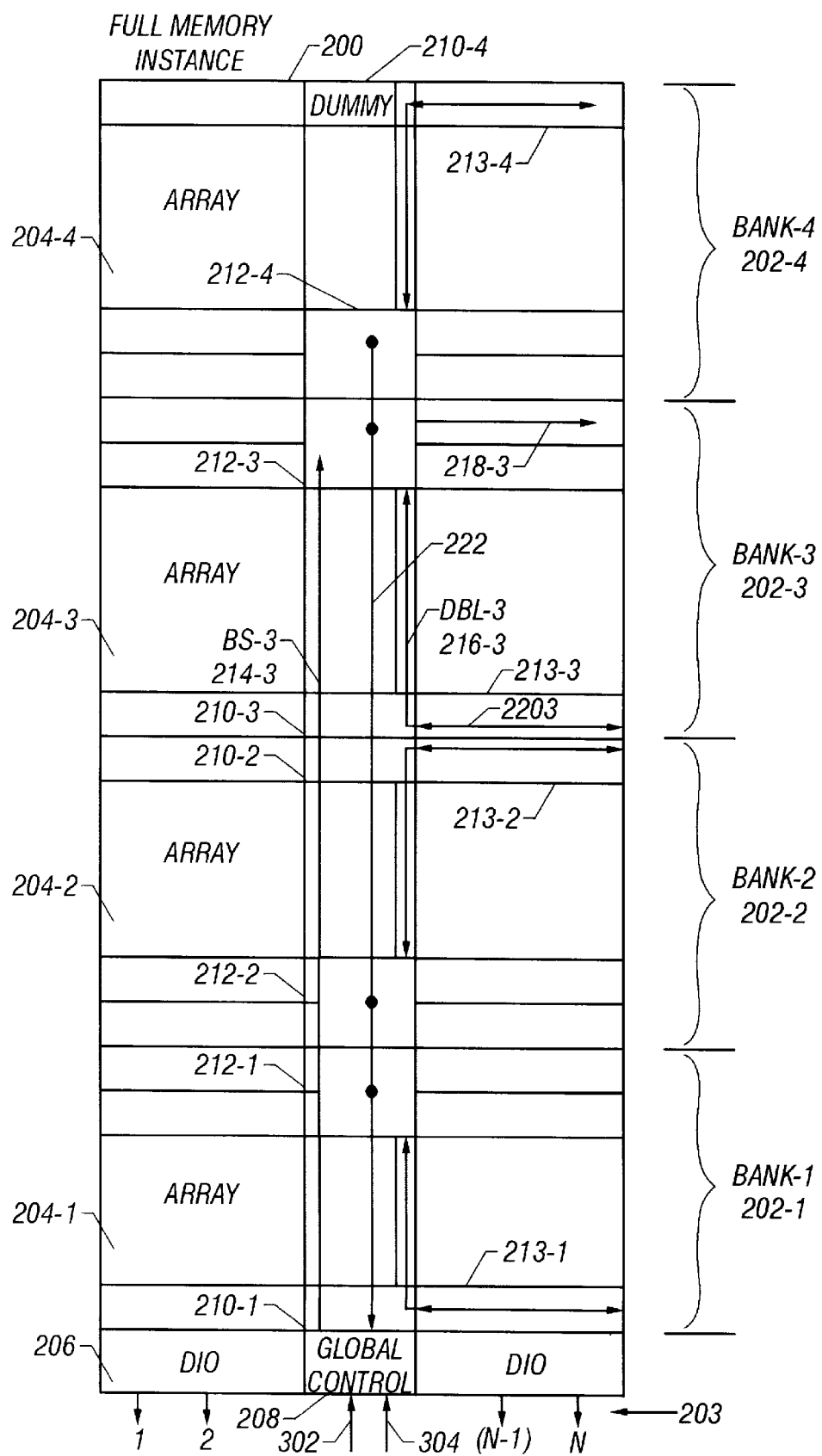
FIG. 2 depicts an exemplary embodiment of a compilable multi-bank memory instance wherein the teachings of the present invention may be advantageously practiced.

Referring now to FIG. 2, depicted therein is an exemplary embodiment of a compilable multi-bank memory instance 200 wherein the teachings of the present invention may be advantageously utilized. The exemplary multi-bank memory instance 200 is comprised of four memory banks (reference numerals 202-1 through 202-4) and is preferably architected to include any number of I/Os 203 (e.g., up to N). A global data I/O (DIO) block 206 provided in the memory instance 200 is operable to effectuate data I/O operations under a global control block 208.

Those skilled in the art should readily recognize that each of the memory banks 202-1 through 202-4 of the memory instance 200 is operable, when selected, as the individual memory bank 100 described in detail hereinabove. Accordingly, each memory bank is provided with a dummy XDEC block (reference numerals 210-1 through 210-4) for selecting a DWL of a DWL block (reference numerals 213-1 through 213-4) associated therewith. Local bank control circuitry (reference numerals 212-1 through 212-4) is provided for each memory bank, which circuitry comprises local clock generator circuitry, local driver circuitry, etc.

Global control circuitry block 208 includes global timing circuitry and circuitry for generating appropriate BS signals used for selecting an individual memory bank of the memory instance 200. For example, a particular BS signal, BS-3 (reference numeral 214-3) is illustrated for selecting bank-3 202-3. Accordingly, BS-3 214-3 is provided to the local bank control circuitry 212-3 of the memory bank 202-3.

In a presently preferred exemplary embodiment of the present invention, the global timing circuitry is operable to drive a timing synchronization node (i.e., the DBITFB node) that is common to each of the individual memory banks and the memory instance as a whole, in order to synchronize the timing of the memory access operation with respect to the selected memory bank with the external master clock applied to the memory instance. Accordingly, in the exemplary embodiment shown, the individual memory banks are tied together such that a single common node signal may be driven on a common bus to each of the memory banks. Reference numeral 222 in FIG. 2 refers to an exemplary commonly-connected DBITFB signal path and, as will be set forth hereinbelow, is driven in tandem by the global timing circuitry as well as the local driver circuit associated with the selected memory bank 202-3.

In response to the dummy access operation in the memory bank 202-3, DWL-3 220-3 is generated by the dummy XDEC block 210-3. DBL-3 216-3 is then driven low, which generates the LSTCLK signal 218-3 for the memory bank 202-3. Further, the local driver circuit provided as part of the local bank control block 212-3 is driven by the DBL-derived reference signal, in order to drive the commonly-connected DBITFB signal path 222.

Figure 3:
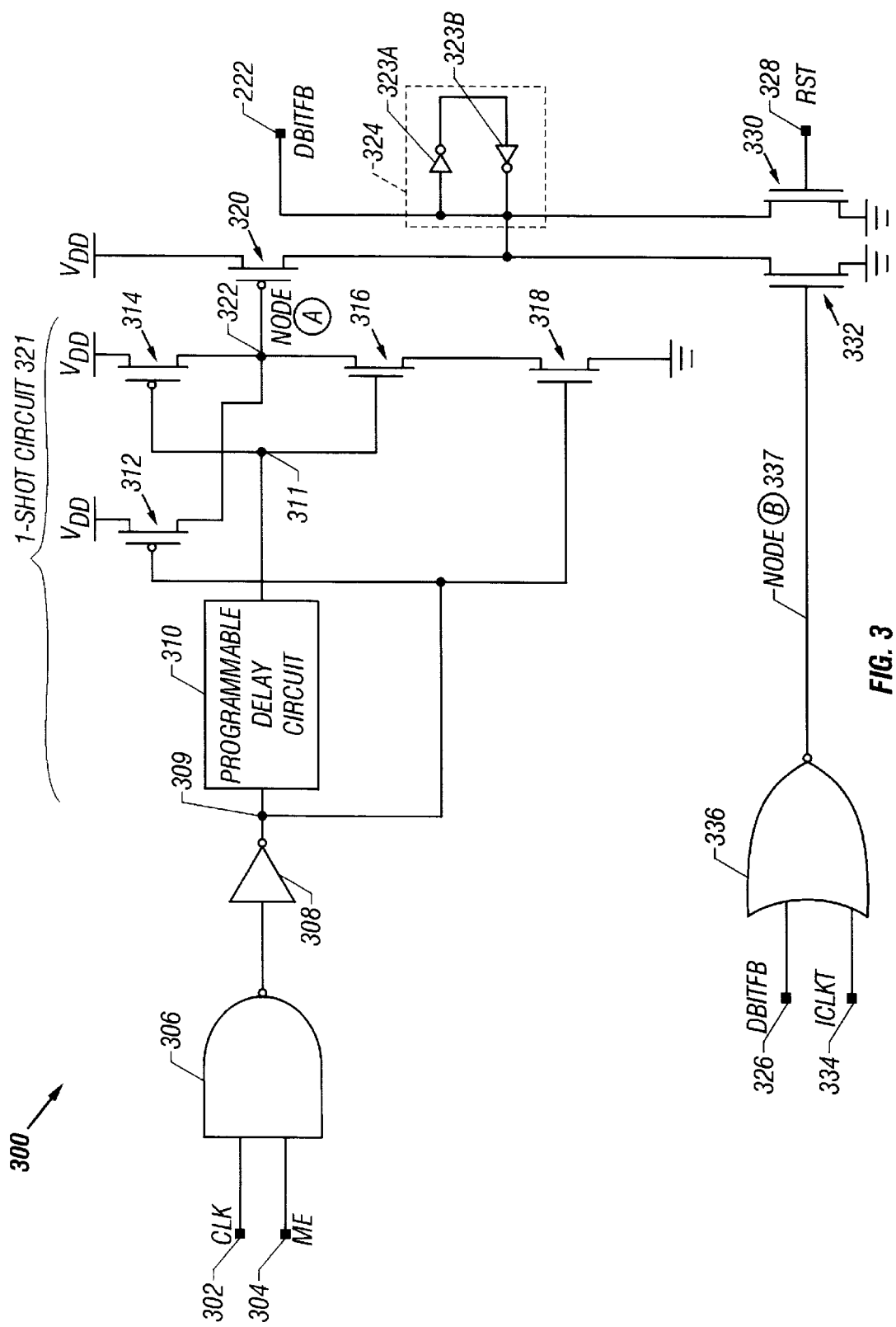
FIG. 3 depicts an exemplary embodiment of a global timing circuit for driving a common node signal.

FIG. 3 depicts a presently preferred exemplary embodiment of a global timing circuit 300 for driving the common DBITFB node 222 in accordance with the teachings of the present invention. As alluded to hereinabove, the global timing circuit 300 is preferably provided as part of the global control circuitry block 208 shown in FIG. 2. The external master clock (CLK) 302 and a memory enable (ME) signal 304 are applied to a NAND gate 306 that is coupled to an inverter 308. A one-shot circuit (reference numeral 321) with programmable delay 310 is provided such that the common node 222 is driven high for a predetermined time period. The programmable delay is provided in order to ensure that the common DBITFB node 222 is driven high for a minimum amount of time in a host of applications wherein variable number of banks and/or different heights of the memory instance are to be accommodated, as may be necessary in compilable architectures.

The output 309 of the inverter 308 (which is also provided as an input to the programmable delay circuit 310) drives the gates of PMOS transistor 312 and NMOS transistor 318. The output 311 of the programmable delay circuit 310 drives the gates of PMOS 314 and NMOS 316, which are coupled together at Node A (reference numeral 322). PMOS devices 312 and 314 are operable to pull Node A 322 to a high value (i.e., $V_{DD}$) when a logic low is applied to their gates. Programmable delay 310 and the NAND gate comprised of transistors 312, 314, 316, and 318 together form the "one-shot" circuit portion 321 whereby Node A undergoes a fixed-time negative pulse in response to the rising edge at output 309. The duration of the programmable delay circuit 310 sets the pulse width of Node A.

Continuing to refer to FIG. 3, Node A 322 drives the gate of PMOS 320 which is coupled to the DBITFB node 222. Accordingly, when both CLK 302 and ME 304 are asserted, Node A 322 is pulsed low, thereby turning on PMOS 320 which pulls the DBITFB node to a high value ($v_{DD}$). In the meantime, as external CLK 302 is asserted, an intermediate clock signal (ICLKT) 334 is generated therefrom, which is applied to a NOR gate 336. The output node (Node B 337) of NOR 336 drives NMOS 332 which is operable to drive the DBITFB node 222 low at the end of the cycle. When ICLKT 334 is asserted (pursuant to the external clock's rising edge), Node B 337 is driven low substantially rapidly, thereby turning off the NMOS pull-down device 332, prior to activation of the PMOS device 320. Accordingly, upon encountering the rising edge of the external clock, the NMOS pull-down device 332 is deactivated and the global timing circuit 300 is operable to drive the DBITFB node 222 to a high value as quickly as possible for a predetermined amount of time (i.e., for the during of the negative pulse of Node A 322), without causing contention between transistors 320 and 332.

A keeper latch 324 (also referred sometimes as a "cheater" latch), comprising circularly-coupled inverters 323A and 323B, is disposed on the DBITFB node 222 so as to maintain the voltage level at the node just in case DBITFB node 222 is ever "undriven" for a brief time interval. It should be appreciated that in the presently preferred exemplary embodiment of the present invention, the DBITFB node is always driven by either the global control circuitry 208 or appropriate local control circuitry (reference numerals 210-1 through 210-4 depicted in FIG. 2). But in extreme configurations of the memory compiler and/or operating conditions, there may be very brief instances where the DBITFB node is floating. Thus, weak inverters (e.g., inverter 323B) provided as part of the keeper latch help hold the DBITFB node at driven state. Further, a reset (RST) signal 328 is provided in a preferred exemplary embodiment of the present invention, which drives a pull-down NMOS device 330 to pull the DBITFB node 222 to ground at the start.

Figure 4A:
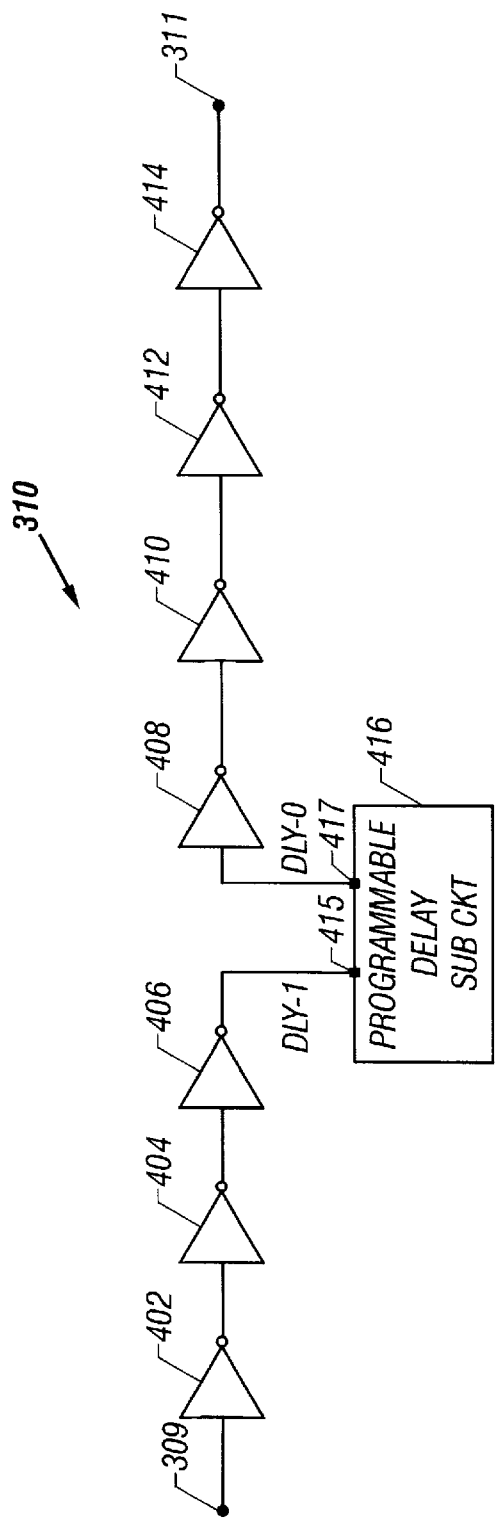
FIG. 4A depicts an exemplary programmable delay circuit used in the global timing circuit for driving the common node signal to a high value for a predetermined period of time.

FIG. 4A depicts an exemplary embodiment of the programmable delay circuit 310 in greater detail. A plurality of inverters (reference numerals 402 through 414) are connected in series between nodes 309 and 311, wherein a programmable delay subcircuit portion 416 is disposed between inverter 406 and inverter 408. Accordingly, a delay input (DLY_I) 415 and delay output (DLY_O) 417 are provided in the programmable delay circuit 310 for introducing a programmable delay of a predetermined time period.

Figure 4B:
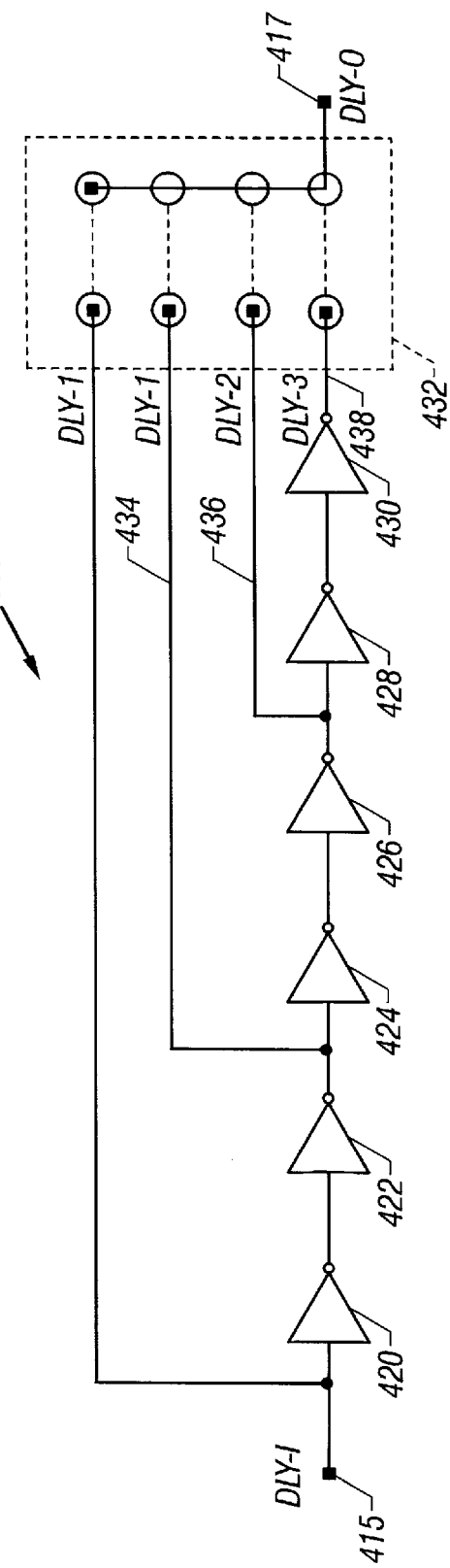
FIG. 4B depicts an exemplary programmable delay sub-circuit.

FIG. 4B depicts an exemplary embodiment of the programmable delay sub-circuit portion 416. A plurality of inverters (reference numerals 420 through 430) are coupled in series with multiple tap points DLY_1 through DLY_3 (reference numerals 434, 436, and 438, respectively). The multiple tap points and the DLY_I signal are provided to a delay selector 432 which couples the DLY_O 417 to a particular tap point or the DLY_I signal, thereby effectuating adjustable amounts of delay between nodes 309 and 311 of the. delay circuit 310. As those skilled in the art should readily appreciate, these delay amounts can be programmed by means of metal options in the memory compiler.

Figure 5:
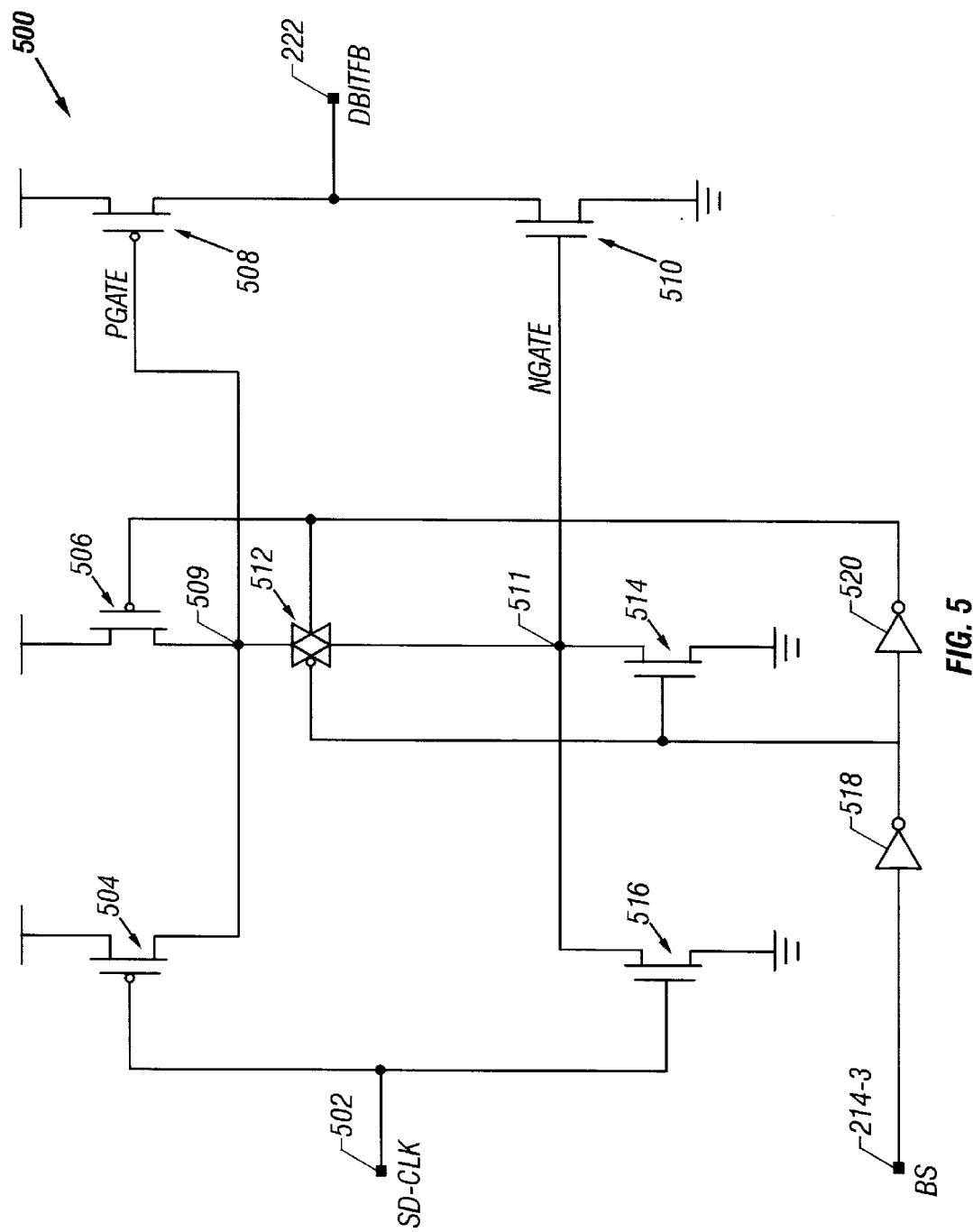
FIG. 5 depicts an exemplary local driver circuit provided in accordance with the teachings of the present invention for driving the common node signal once a particular memory bank is selected.

Referring now to FIG. 5, depicted therein is an exemplary local driver circuit 500 provided in accordance with the teachings of the present invention for driving the common node DBITFB signal 222 once a particular memory bank is selected. The local driver circuit 500, forming a portion of the local clock generator circuitry block 110 shown in FIG. 1, is preferably provided as circuitry whose functionality is determined by the BS signal that is applied as an input. Essentially, the local driver circuit is operable as an inverter pair coupled in series between a reference signal (SD_CLK) node 502 and DBITFB 222 when the BS signal is high. On the other hand, the local driver circuit tri-states the DBITFB node when BS is low, ensuring that unselected banks do not interfere with the passing of control between the global control circuitry 300 and local control circuitry 110 (which, in the case of this example, comprises circuitry 212-3 where Bank-3 is selected). The SD_CLK reference signal 502, which is derived from the DBL signal (with the same polarity but a few stages later), is applied as one input and the BS signal (e.g., BS-3 214-3) is applied as the tri-state control input. Initially, the SD_CLK signal 502 is at a high value because of the high DBL signal after the completion of a previous access cycle. When BS-3 214-3 is activated to select the memory bank associated therewith, inverters 518 and 520 operate such that a pass gate 512 disposed between nodes 509 and 511 is activated to conduct. Accordingly, nodes 509 and 511 operate as a common output of a CMOS inverter comprising transistors 504 and 516. It should be appreciated that transistors 508 and 510 operate as a tristatable CMOS inverter coupled to the DBITFB node 222, wherein the P-gate device 508 operates as the pull-up device and the N-gate device 510 operates as the pull-down device.

In operation, when SD_CLK 502 is initially high and BS-3 214-3 is driven high, the pass gate 512 couples nodes 509 and 511, whereby a logic low is applied to the P-gate which turns the PMOS device 508 on. On the other hand, the NMOS device 510 is off because of the logic low applied to the N-gate. Accordingly, the DBITFB node 222 is driven high by the local bank. Thus, control has been handed off from the global timing control circuit 300 whose P-channel pull-up device 320 (FIG. 3) shuts off after the previously described one-shot delay. When SD_CLK 502 is driven low because the DBL in the selected bank is driven low, the DBITFB node 222 is also driven low because the PMOS device 508 is off and the NMOS device 510 is on. When BS-3 214-3 is deasserted, the DBITFB node 222 is tri-stated locally, regardless of the logic state of the SD_CLK signal.

To complete the cycle, as DBITFB is driven low by NGATE 511 in the locally selected bank, NOR 336 in the global timing control circuit 300 (FIG. 3) is activated to turn on the N-channel device 332 to keep the common DBITFB node 222 driven until a new cycle is initiated by the rising edge of the external clock. In an exemplary embodiment, ICLKT node 334 is preferably rendered low prior to DBITFB falling.

Figure 6:
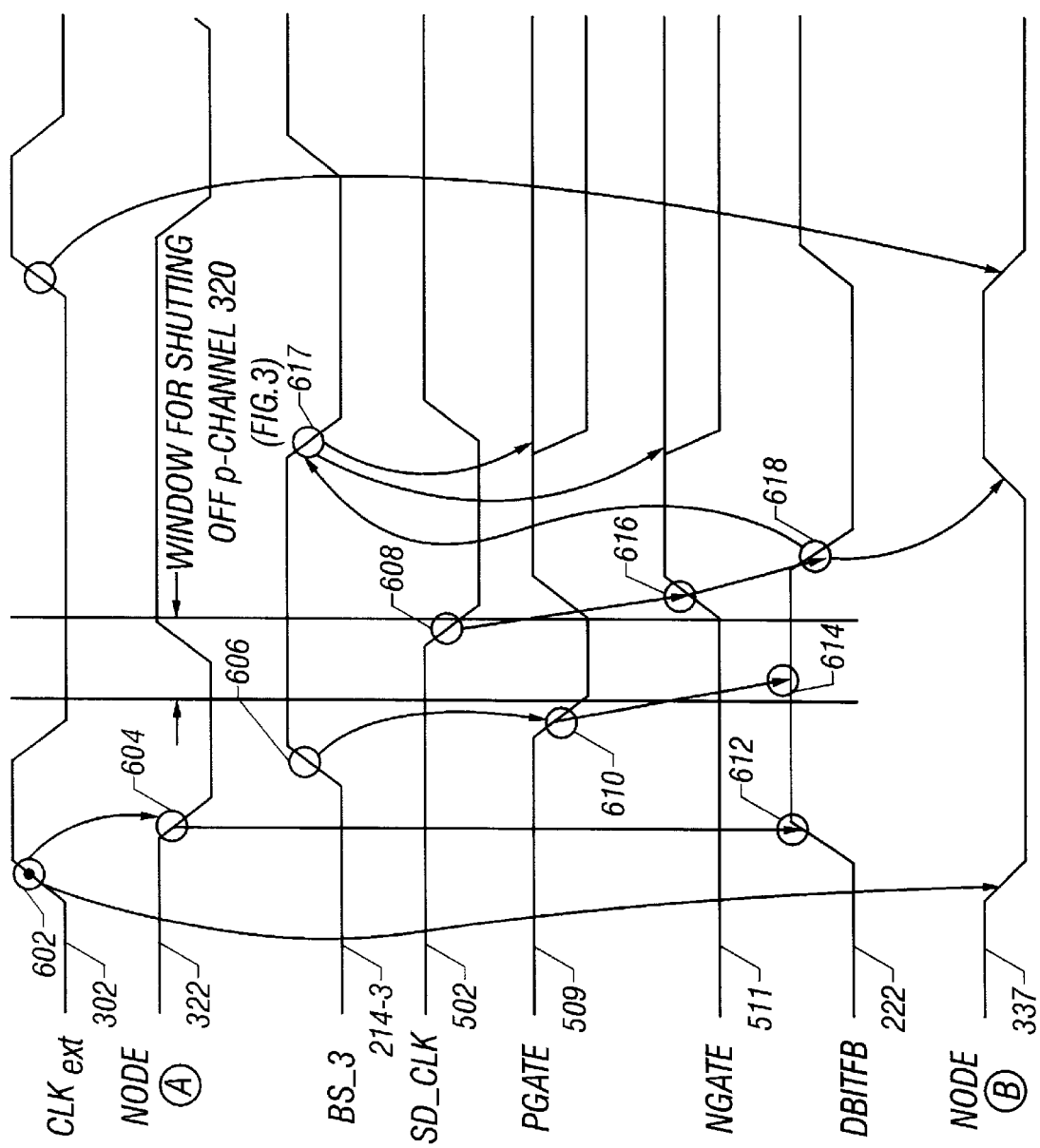
FIG. 6 is a timing diagram which depicts timing relationships among the various signals used in the practice of the present invention.

FIG. 6 is a timing diagram which depicts timing relationships among the various signals used in the practice of the present invention. Upon encountering a rising edge 602 in the external master CLK signal 302, the global timing circuit 300 (shown in FIG. 3) operates to drive Node A 322 to a low value, thereby creating a falling edge 604. Accordingly, the DBITFB node 222 is driven high by the global timing circuit 300 for a predetermined time period, as exemplified by a rising edge 612 in the DBITFB signal. When memory bank 202-3 (FIG. 2) is selected for a memory access operation by driving associated BS-3 214-3 high (rising edge 606), PGATE 509 of the local driver circuit 500 (depicted in FIG. 5) is driven low because of the initial high state of SD_CLK 502. The falling edge 610 of PGATE 509 maintains the high value of the DBITFB signal, as exemplified by reference numeral 614. Node A goes back to the high level upon completion of the one-shot pulse. The window for the ideal rising edge of Node A rising is determined by low-going transition 610 of PGATE 509 and the high-going transition 616 on NGATE 511, as is illustrated in the timing diagram. Thereafter, upon completion of the memory access operation within the local bank, DBL is driven low which is propagated to SD_CLK as a falling edge 608. As a consequence, NGATE 511 of the local driver circuit 500 is driven high. Accordingly, the rising edge 616 of NGATE 511 turns the NMOS device 510 on, which pulls the global DBITFB signal to ground. NGATE 511 and PGATE 509 are tri-stated once BS-3 214-3 is pulled low (as exemplified by the falling edge 617). The deselection of BS-3 (i.e., the falling edge 617) is actually initiated by the falling edge 618 of DBITFB 222.

When global timing circuit 300 encounters a falling edge in the external clock, the latching of address information for the next access cycle is not initiated until the DBITFB node is pulled low by the global timing circuit. While the intermediate clock ICLKT 334 (shown in FIG. 3) goes low because of the falling edge in the external clock, Node B 337 is not driven high until the DBITFB node is pulled low (which is accomplished by the local driver circuit initially). Thereafter, the pulldown NMOS device 332 of the global timing circuit continues to drive the DBITFB node. Subsequently, the low DBITFB signal enables the input of the next cycle's address information into the memory instance.

Figure 7A:
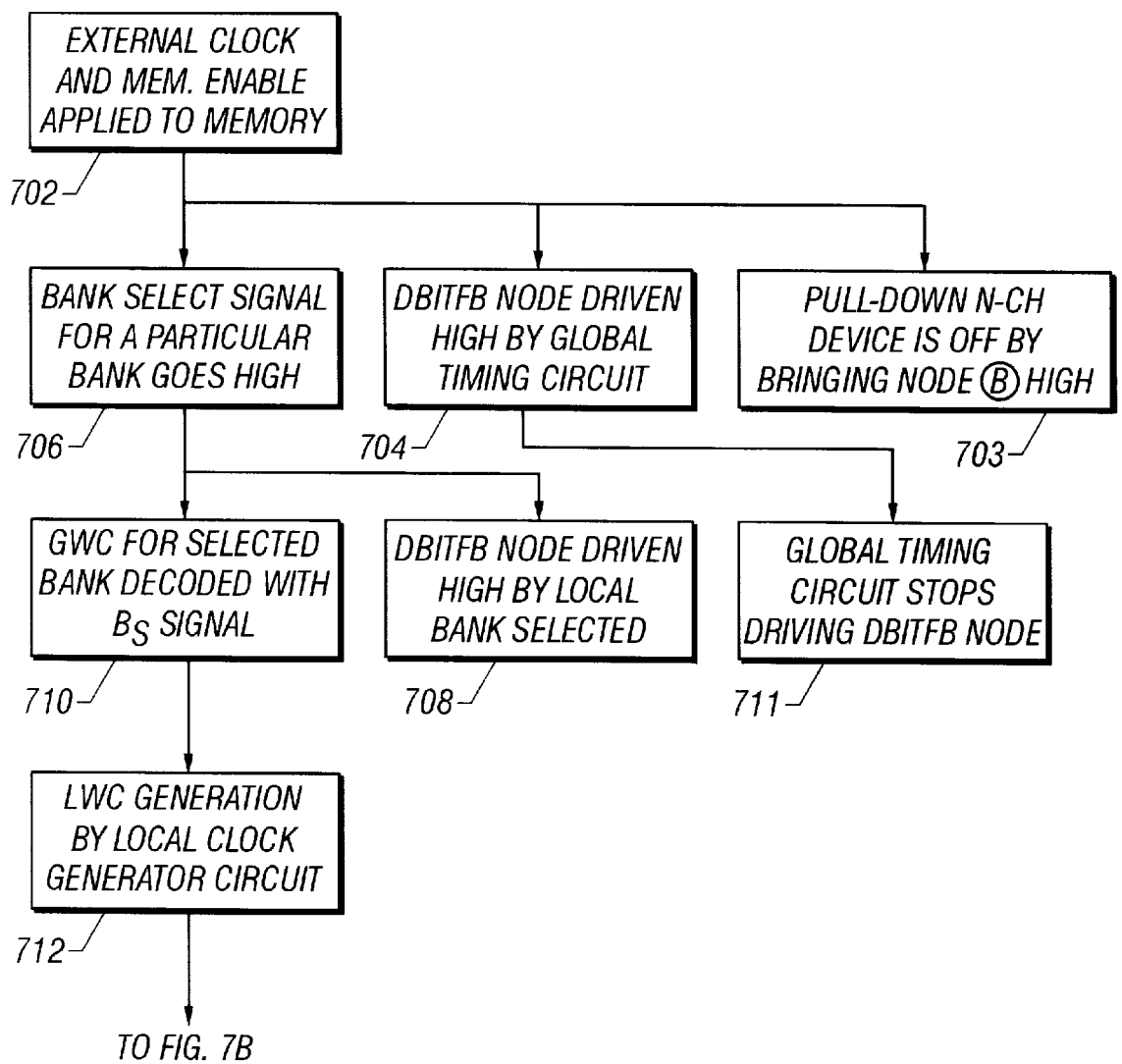
FIGS. 7A and 7B depict a flow chart of the steps involved in the timing synchronization method of the present invention.
Figure 7B:
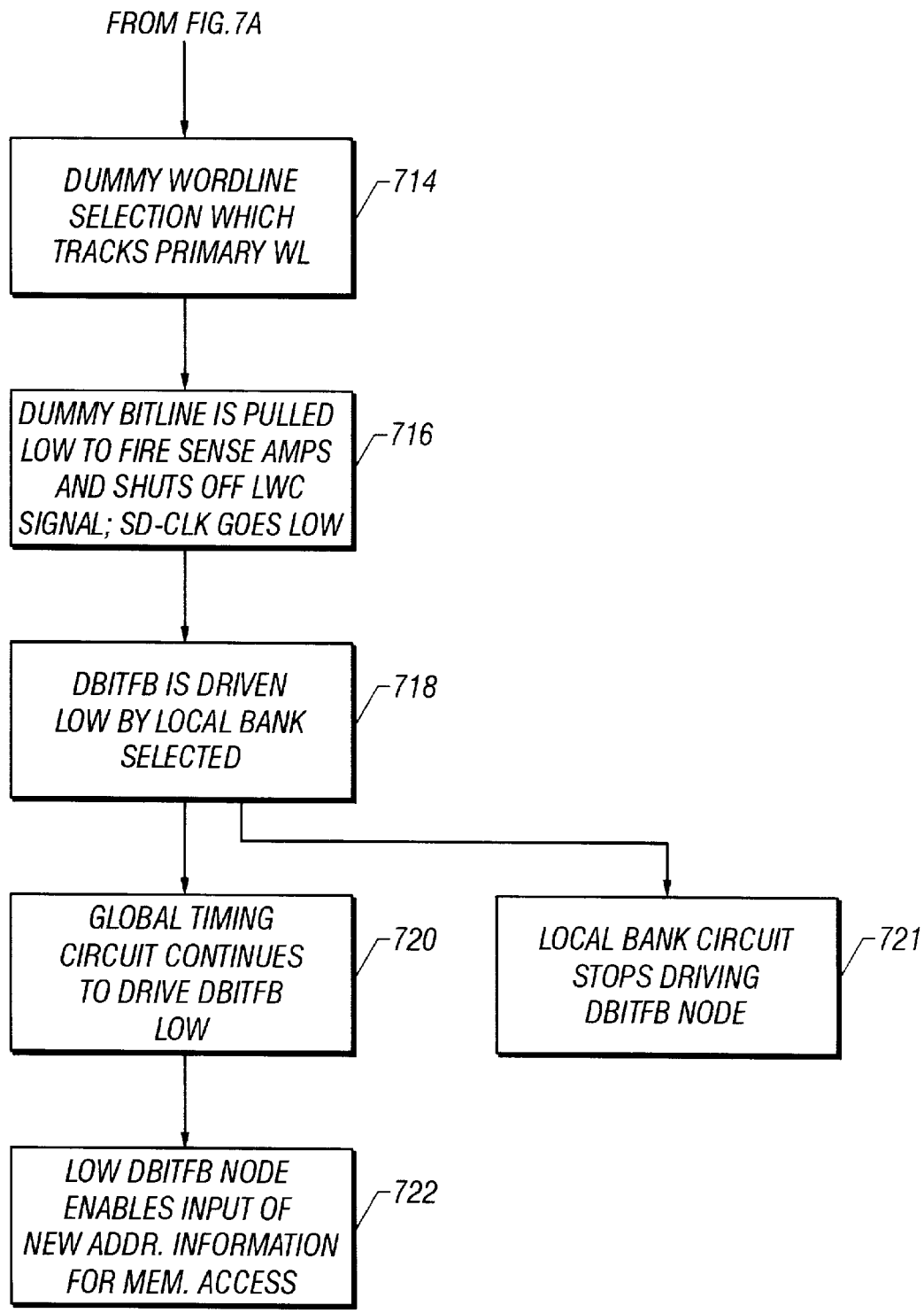

FIGS. 7A and 7B depict the foregoing sequence of events in a flow chart of the steps involved in synchronizing the memory access operation with the address input operation (i.e., self-timing) in accordance with the teachings of the present invention. Upon applying the external clock and memory enable signals to the multi-bank memory instance (step 702), the DBITFB node is driven high by the global timing circuit as described in detail hereinabove (step 704). In parallel, the N-channel pulldown device 332 is shut off by quickly bringing Node B 337 high (step 703). Further in parallel, a particular BS signal is pulled high in order to select a specific memory bank for accessing a memory location therein (step 706). The DBITFB node is driven high by the selected bank's local driver circuit (step 708) upon transferring control from the global timing circuit, which stops driving the DBITFB node (step 711). In parallel, a set of GWC signals associated with the selected bank are decoded using the BS signal (step 710) to generate an LWC signal in the selected bank's local clock generator block (step 712). A dummy memory cell is accessed via a DWL decoded by the dummy XDEC, which tracks the timing path of a primary cell access (step 714). A DBL is pulled low (activating Sense Amp circuitry for completing the access operation), which creates a falling edge in SD_CLK reference signal (step 716). The local bank's control circuitry thereafter drives the DBITFB node low (step 718), until BS is deselected, thereby tri-stating the local driver circuitry 500. The local bank control circuit thus stops driving the DBITFB node (step 721), whereupon the global timing circuit continues to drive DBITFB low when Node B 337 is driven high by the low-going edge of DBITFB (step 720), which enables the input of address inputs into the memory instance for the next access operation (step 722).

Based on the foregoing, it should be appreciated that the present invention advantageously provides a self-timing scheme which synchronizes individual memory bank's access operation with the global address input operations of a multi-bank memory instance. Tandem driving of a common node between the global and local control circuits allows coordinating the two operations such that address information is not taken in before the access is completed. A key feature of the presently preferred exemplary embodiment of the present invention is that the common node is constantly driven by large, low impedance P-channel and N-channel transistors, which eliminates the possibility of unwanted glitches on the common DBITFB node due to capacitive coupling from parallel fill signal lines. Accordingly, wordline glitching (and consequent data corruption) is advantageously avoided thereby.

It is believed that the operation and construction of the present invention will be apparent from the foregoing Detailed Description. While the process and circuitry shown and described have been characterized as being preferred, it should be readily understood that various changes and modifications could be made therein without departing from the scope of the present invention as set forth in the following claims. For example, the specific components and gates comprising the local driver and global timing circuits should be deemed to be only illustrative rather than limiting, as one of skilled in the art should readily recognize that identical or substantially similar logic functionality may be obtained by different device/gate implementations. Further, the one-shot circuit with programmable delay used in the global timing circuitry may be implemented by using a host of known logic gate combinations. Also, the logic states of different signals used in the present invention may be transposed, mutatis mutandis, without deviating from the spirit of the present invention while obtaining an overall functional result that is substantially the same as disclosed and described herein. Yet another possible variation includes a solution where a feedback line is provided for each bank of the memory instance, wherein OR-type logic is provided in the global clock circuitry to detect the arrival of one of the feedback lines before allowing in the address information for the subsequent cycle. A potential drawback in this approach is lack of scalability to compiler architectures containing many memory banks, since the area penalty for the lines may become unacceptable for some applications. However, such implementational considerations do not limit the present invention. Accordingly, all such modifications, substitutions, extensions, additions, combinations, et cetera, should be considered to be within the ambit of the present invention whose scope is limited solely by the claims appended hereinbelow.

What is claimed is:

1. A timing synchronization method for synchronizing a falling edge of an external master clock signal to a falling edge of a common node signal in a memory instance having a plurality of banks, comprising the steps of:

upon application of said external master clock signal to said memory instance, driving said common node signal to a high value by a global clock circuit disposed in said memory instance;

selecting a particular bank of said memory instance for an access operation with respect to a memory location disposed therein by activating a bank select (BS) signal associated with said particular bank;

driving said common node signal to said high value by a local driver circuit associated with said particular bank, said local driver circuit receiving said BS signal and a reference signal produced in said particular bank;

upon driving said reference signal low pursuant to completing said access operation, driving said common node signal to a low value by said local driver circuit and thereby generating a falling edge in said common node signal; and upon encountering a falling edge in said external master clock signal, driving said common node signal to said low value by said global clock circuit, wherein said low value of said common node signal facilitates inputting of address signals for a subsequent access operation with respect to said memory instance.

2. The timing synchronization method as set forth in claim 1, wherein said common node signal is driven to said high value by said global clock circuit for a predetermined time period using a one-shot circuit with a programmable delay.

3. The timing synchronization method as set forth in claim 2, wherein said access operation comprises a memory read operation.

4. The timing synchronization method as set forth in claim 2, wherein said access operation comprises a memory write operation.

5. The timing synchronization method as set forth in claim 2, further comprising the step of applying a memory enable signal to said global clock circuit disposed in said memory instance.

6. The timing synchronization method as set forth in claim 2, wherein said memory location comprises a static random access memory (SRAM) location.

7. The timing synchronization method as set forth in claim 2, wherein said memory location comprises a dynamic random access memory (DRAM) location.

8. The timing synchronization method as set forth in claim 2, wherein said memory location comprises an erasable programmable read-only memory (EPROM) location.

9. The timing synchronization method as set forth in claim 2, wherein said common node signal is provided to each of said plurality of banks on a common bus.

10. The timing synchronization method as set forth in claim 2, wherein said common node signal is provided to each of said plurality of banks on a separate bus.

11. A compilable memory instance, comprising:

a plurality of memory banks, each being independently selectable by a bank select (BS) signal generated by a global control circuit;

a global timing circuit operable to drive a common node signal to a high value upon application of an external master clock and a memory enable signal, said common node signal being applied to a particular memory bank selected by a specific BS signal associated therewith;

a local driver circuit associated with said particular memory bank for maintaining said common node signal at said high value upon receiving said specific BS signal; and a local clock generator circuit associated with said particular memory bank for generating a local wordline clock to synchronize a memory access operation with respect to a memory location of said particular memory bank and to synchronize a dummy access operation, said memory access operation and said dummy access operation having substantially the same timing delay, wherein said local driver portion is operable to drive said common node signal to a low value upon receiving an indication that a reference signal produced in said particular memory bank is driven low, said reference signal being generated pursuant to completing said dummy access operation.

12. The compilable memory instance as set forth in claim 11, wherein said common node signal is driven to said high value by said global timing circuit for a predetermined time period using a one-shot circuit with a programmable delay.

13. The compilable memory instance as set forth in claim 12, wherein said memory access operation comprises a read operation.

14. The compilable memory instance as set forth in claim 12, wherein said memory access operation comprises a write operation.

15. The compilable memory instance as set forth in claim 12, wherein said common node signal is provided to each of said plurality of memory banks on a common bus.

16. The compilable memory instance as set forth in claim 12, wherein said common node signal is provided to each of said plurality of memory banks on a separate bus.

17. The compilable memory instance as set forth in claim 12, wherein said plurality of memory banks comprise static random access memory (SRAM) banks.

18. The compilable memory instance as set forth in claim 12, wherein said plurality of memory banks comprise dynamic random access memory (DRAM) banks.

19. The compilable memory instance as set forth in claim 12, wherein said plurality of memory banks comprise erasable programmable read-only memory (EPROM) banks.

* * * * *